United States Patent
Obata et al.

(10) Patent No.: US 8,856,626 B2
(45) Date of Patent: Oct. 7, 2014

(54) DECODER, DECODING METHOD AND COMMUNICATION APPARATUS

(71) Applicant: Kabushiki Kaisha Toshiba, Tokyo (JP)

(72) Inventors: Haruka Obata, Tokyo (JP); Hironori Uchikawa, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 69 days.

(21) Appl. No.: 13/746,925

(22) Filed: Jan. 22, 2013

(65) Prior Publication Data

US 2013/0254633 A1   Sep. 26, 2013

(30) Foreign Application Priority Data

Mar. 21, 2012  (JP) .................................. 2012-064544

(51) Int. Cl.
*H03M 13/00*   (2006.01)

(52) U.S. Cl.
USPC .......................................... 714/779; 714/774

(58) Field of Classification Search
USPC ................................. 714/779, 774
See application file for complete search history.

(56) References Cited

U.S. PATENT DOCUMENTS

| | | | |
|---|---|---|---|
| 2002/0099998 A1* | 7/2002 | Nieminen | 714/792 |
| 2011/0167313 A1* | 7/2011 | Miller et al. | 714/752 |
| 2011/0173010 A1* | 7/2011 | Lecomte et al. | 704/500 |

OTHER PUBLICATIONS

Marco Papaleo et al: "Windowed Erasure Decoding of LDPC Convolution Codes": ITW 2010 IEEE: Jan. 6-8, 2010: pp. 1-5 (in English).

* cited by examiner

*Primary Examiner* — M. Mujtaba K Chaudry
(74) *Attorney, Agent, or Firm* — Holtz Holtz Goodman & Chick PC

(57) ABSTRACT

According to one embodiment, a decoder includes a control unit and a decoding unit. The control unit determines a window size applied to a first target frame to be a first value and determines a window size applied to a second target frame different from the first target frame to be a second value different from the first value. The decoding unit carries out windowed decoding of a spatially coupled code on the first target frame with the window size set to the first value and carries out windowed decoding of a spatially coupled code on the second target frame with the window size set to the second value.

18 Claims, 7 Drawing Sheets

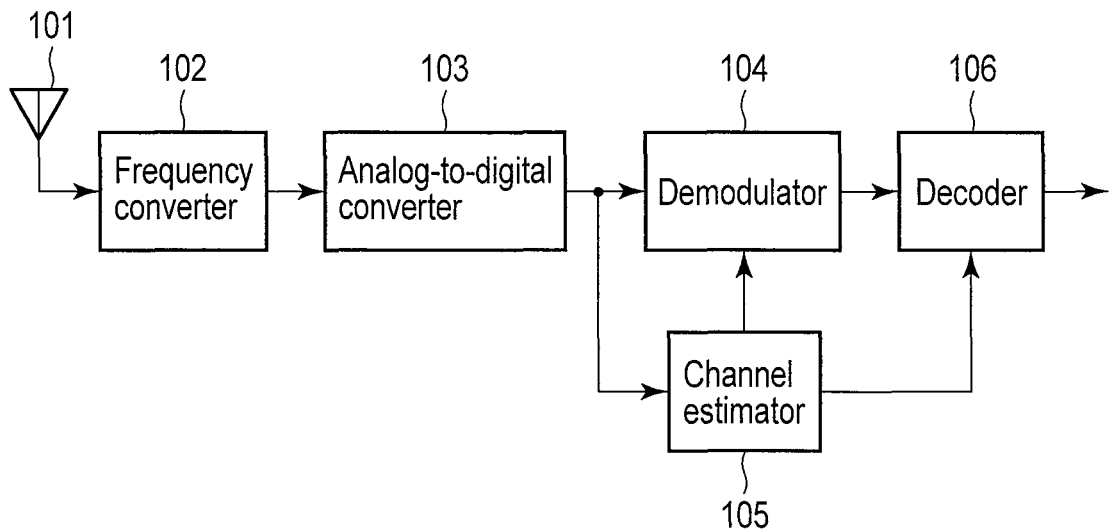
F I G. 1
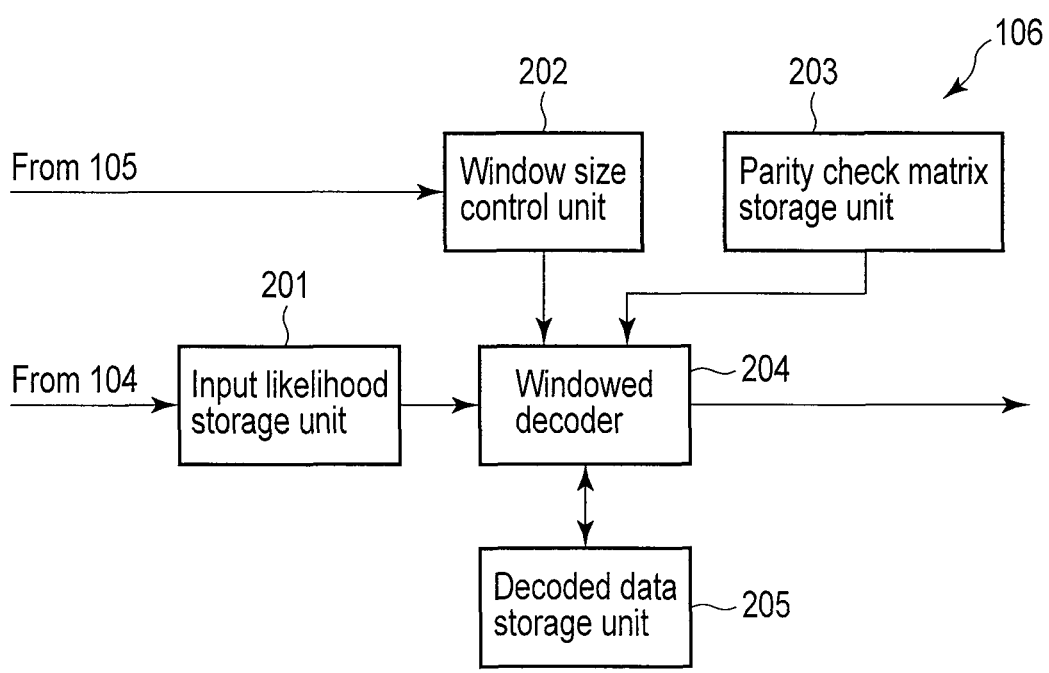
F I G. 2

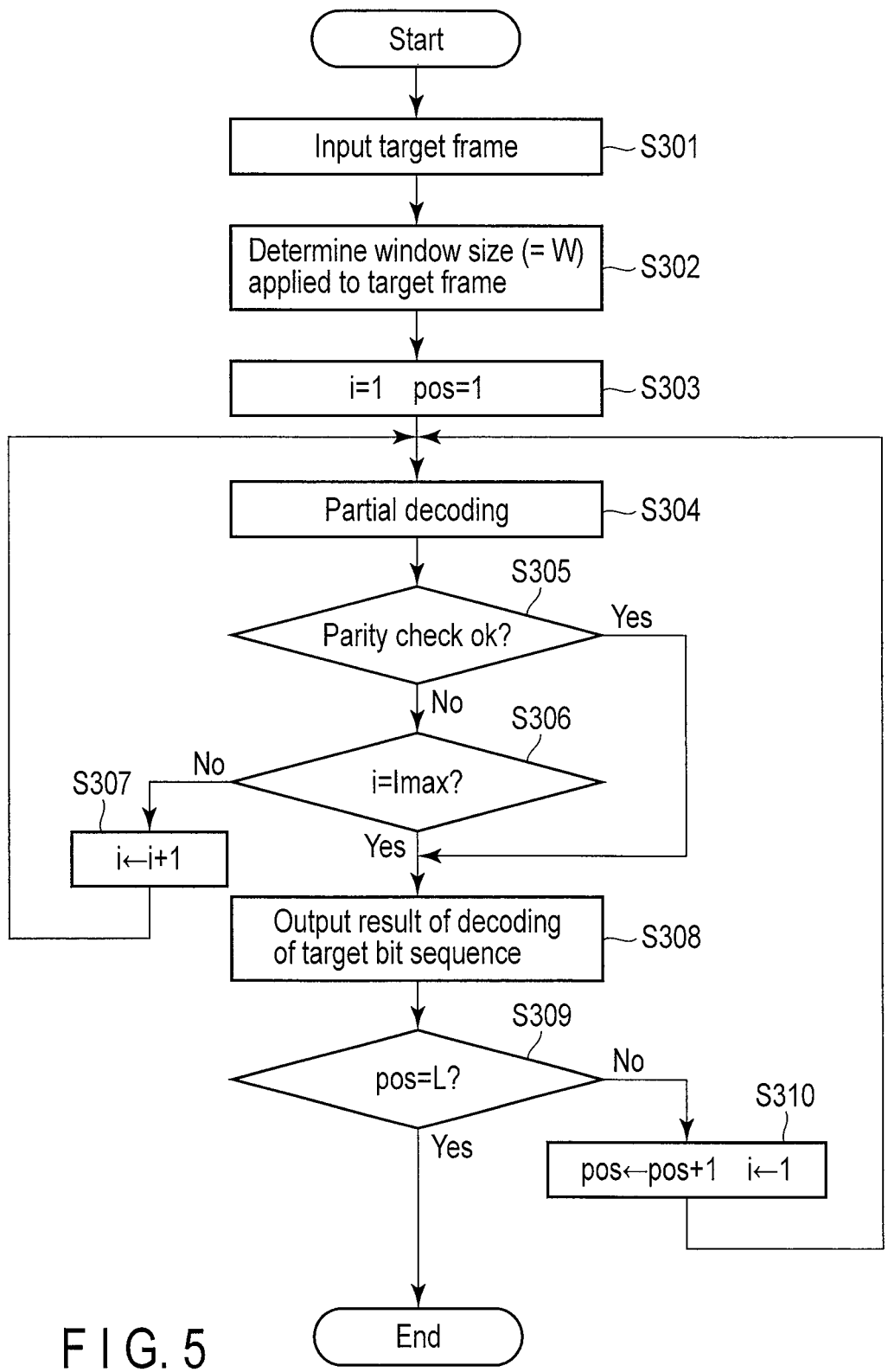
F I G. 5

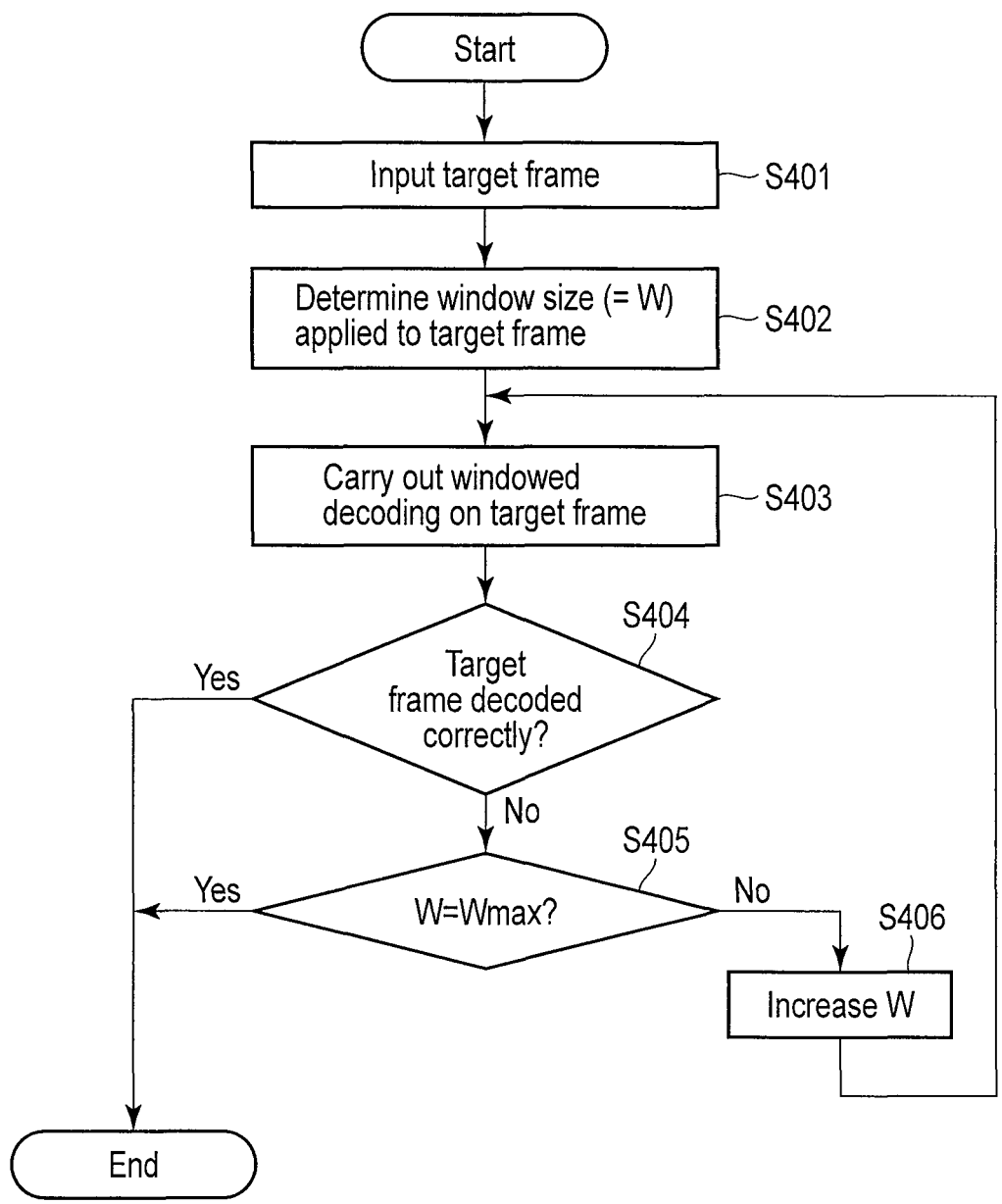
F I G. 6

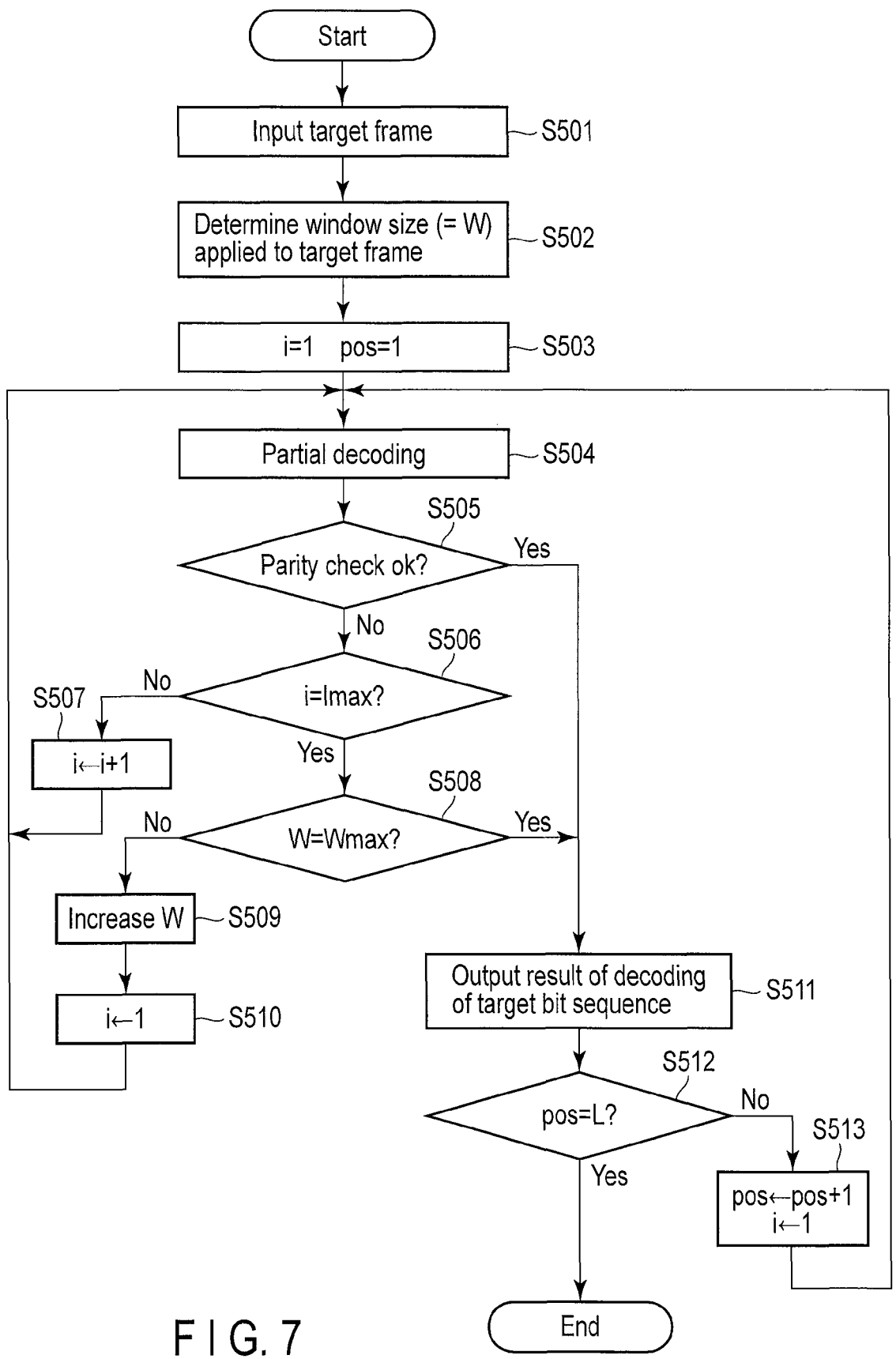
F I G. 7

US 8,856,626 B2

DECODER, DECODING METHOD AND COMMUNICATION APPARATUS

CROSS-REFERENCE TO RELATED APPLICATIONS

This application is based upon and claims the benefit of priority from Japanese Patent Application No. 2012-064544, filed Mar. 21, 2012, the entire contents of which are incorporated herein by reference.

FIELD

Embodiments described herein relate generally to decoding of a spatially coupled code.

BACKGROUND

A parity check matrix for a spatially coupled code (also referred to as a low-density parity check (LDPC) convolutional code) is a band matrix based on a party check matrix for a regular LDPC code. For the spatially coupled code, a channel capacity (Shannon limit) can be achieved by iterative decoding (that is, belief propagation [BP] decoding).

BRIEF DESCRIPTION OF THE DRAWINGS

FIG. 1 is a block diagram illustrating a communication apparatus incorporating a decoder according to each embodiment;

FIG. 2 is a block diagram illustrating a decoder according to a first embodiment;

FIG. 5 is a flowchart illustrating a decoding process carried out by the decoder according to the first embodiment;

FIG. 6 is a flowchart illustrating a decoding process carried out by a decoder according to a second embodiment;

FIG. 7 is a flowchart illustrating a decoding process carried out by a decoder according to a third embodiment;

DETAILED DESCRIPTION

Figure 3:
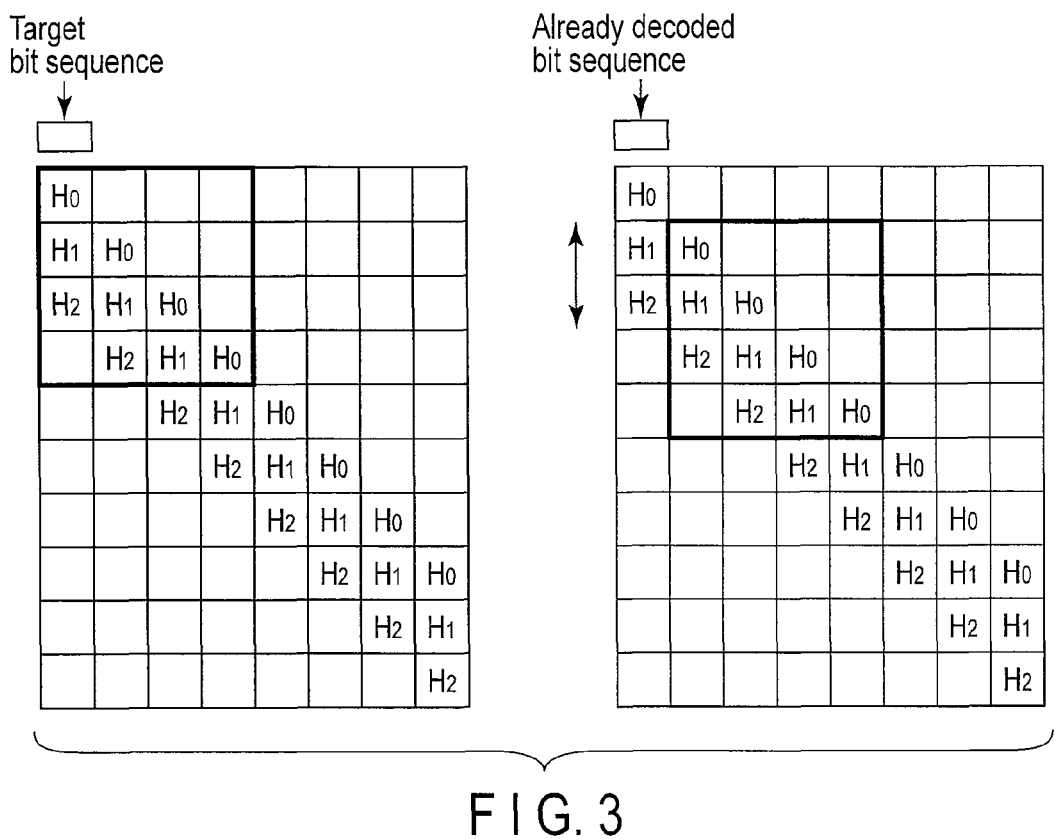
FIG. 3 is a diagram illustrating windowed decoding.

Embodiments will be described below with reference to the drawings.

In general, according to one embodiment, a decoder includes a control unit and a decoding unit. The control unit determines a window size applied to a first target frame to be a first value and determines a window size applied to a second target frame different from the first target frame to be a second value different from the first value. The decoding unit carries out windowed decoding of a spatially coupled code on the first target frame with the window size set to the first value and carries out windowed decoding of a spatially coupled code on the second target frame with the window size set to the second value.

Elements that are the same as or similar to described elements are denoted by the same or similar reference numerals, and duplicate descriptions are basically omitted.

A decoder according to each of the embodiments may be incorporated into various devices that require error correction decoding. Specifically, the decoder may be incorporated into a communication system, for example, a receiver or a transceiver, or a recording and reproducing system, for example, a storage apparatus.

For example, the decoder according to each embodiment may be incorporated into a communication apparatus shown in FIG. 1. The communication apparatus in FIG. 1 comprises an antenna 101, a frequency converter 102, an analog-to-digital converter 103, a demodulator 104, a channel estimator 105, and a decoder 106. The communication apparatus in FIG. 1 may include functional units such as a low noise amplifier and a filter (not shown in the drawings). Moreover, the communication apparatus in FIG. 1 may include a functional unit configured to modulate, encode and transmit data.

The communication apparatus in FIG. 1 receives a modulated and encoded signal and demodulates and decodes the received signal to restore received data. The communication apparatus in FIG. 1 may typically be a radio receiver (which supports a radio communication scheme, for example, a cellular communication system or a wireless LAN (Local Area Network)) or a broadcasting wave receiver.

The antenna 101 receives a high-frequency RF signal and outputs the received signal to the frequency converter 102. The frequency converter 102 inputs the received RF signal from the antenna 101. The frequency converter 102 down-converts the received RF signal to obtain an intermediate frequency signal. The frequency converter 102 outputs the intermediate frequency signal to the analog-to-digital converter 103.

The analog-to-digital converter 103 inputs the intermediate-frequency signal from the frequency converter 102. The analog-to-digital converter 103 converts the intermediate frequency signal from an analog domain into a digital domain to obtain a digital received signal. The analog-to-digital converter 103 outputs the digital received signal to the demodulator 104 and the channel estimator 105.

The channel estimator 105 estimates channel information using, for example, a pilot signal. The channel information includes, for example, a received SNR and fading information. The channel estimator 105 outputs the channel information to the demodulator 104 and the decoder 106. If the decoder 106 is configured to control a window size described below without using the channel information, the channel estimator 105 need not output the channel information to the decoder 106.

The demodulator 104 inputs the digital received signal from the analog-to-digital converter 103 and also inputs the channel information from the channel estimator 105. The demodulator 104 demodulates the digital received signal in accordance with a demodulation scheme corresponding to a modulation scheme applied by a transmitter, to obtain demodulated data. The demodulator 104 outputs the demodulated data to the decoder 106.

The demodulator 104 utilizes the channel information to accurately demodulate the digital received information. If the decoder 106 is configured to feed back a posteriori likelihood to the demodulator 104 upon a failure in decoding, the demodulator 104 may carry out demodulation using the fed-back a posteriori likelihood.

The decoder 106 incorporates a decoder according to any of the embodiments described below. The decoder 106 inputs the demodulated data from the demodulator 104. The demodulated data corresponds to the input likelihood of a spatially coupled code frame. The decoder 106 decodes the spatially coupled code frame in accordance with a decoding scheme corresponding to spatially coupled coding that is a encoding scheme applied by the transmitter, to obtain decoded data (that is, a data frame is restored). Specifically, the decoder 106 determines a window size applied to windowed decoding described below, and carries out windowed decoding based on the window size to obtain decoded data. The decoder 106 outputs the decoded data to an outside of the communication apparatus. The decoder 106 may input the channel information and control the window size based on the channel information as necessary.

Furthermore, as described above, the decoder according to each of the embodiments may be incorporated into a storage apparatus. For example, the decoder according to each embodiment may be incorporated into a storage apparatus 603 shown in FIG. 8.

Figure 8:
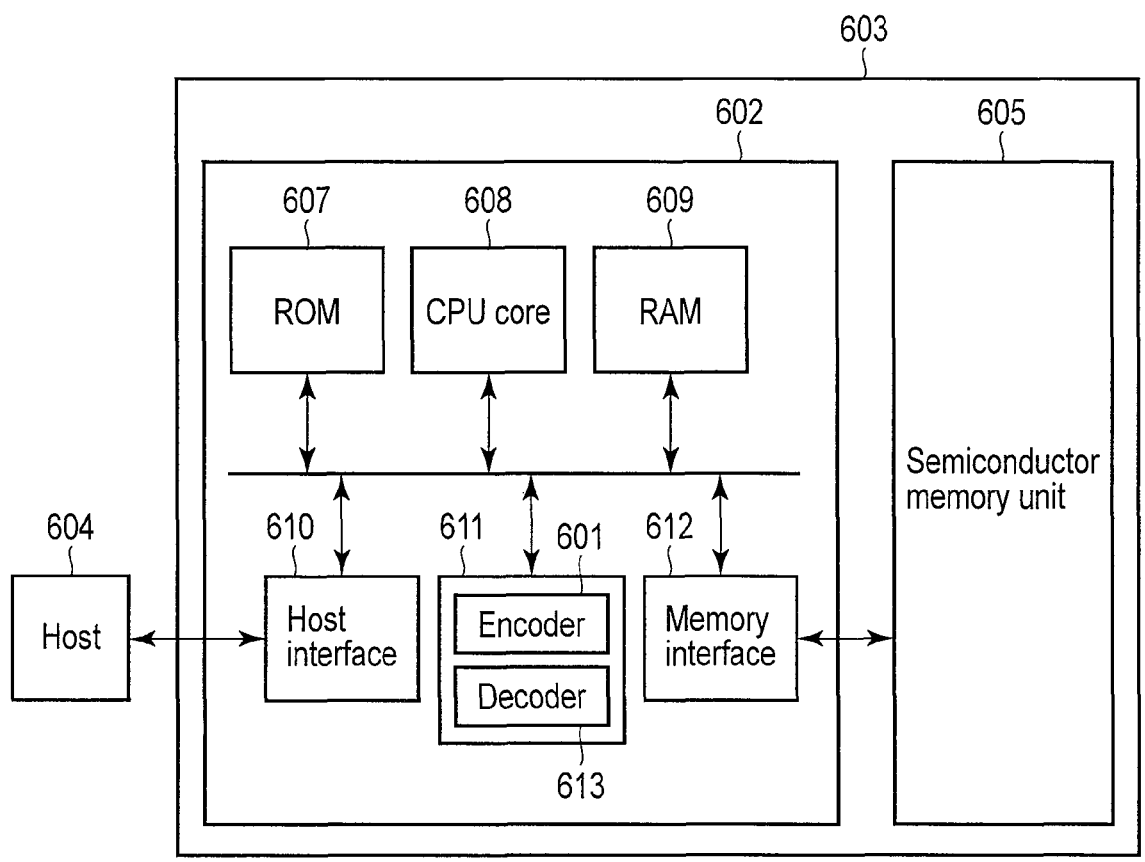
FIG. 8 is a block diagram illustrating a storage apparatus incorporating the decoder according to each embodiment.

The storage apparatus 603 in FIG. 8 comprises at least one semiconductor memory unit 605 that is a non-volatile memory, for example, a flash memory, and a memory controller 602 that controls the semiconductor memory unit 605. The storage apparatus 603 is connected to a host 604 (for example, a personal computer) to transmit and receive data to and from the host 604. For example, the host 604 can read data from the storage apparatus 603 and write data to the storage apparatus 603.

The memory controller 602 comprises a read-only memory (ROM) 607, a central processing unit (CPU) core 608, a random access memory (RAM) 609, a host interface 610, an error correction unit 611, and a memory interface 612. The elements of the memory controller 602 are connected together by a bus 606.

The CPU core 608 transmits and receives data to and from the host 604 via the host interface 610 and transmits and receives data to and from the semiconductor memory unit 605 via the memory interface 612. That is, the CPU core 608 functions as a read unit that receives data from the semiconductor memory unit 605 and as a write unit that transmits data to the semiconductor memory unit 605. Furthermore, FW (Firmware) executed on the CPU core 608 implements address management for the semiconductor memory unit 605 including limitation of the number of rewrites. Moreover, the FW controls the whole storage apparatus 603 in accordance with a command input from the host 604.

The ROM 607 stores, for example, a control program for the storage apparatus 603. The RAM 609 stores an address conversion table required for address management, information about an abnormal circuit, and the like.

The error correction unit 611 includes an encoder 601 and a decoder 613. The encoder 601 carries out error correcting encoding on data written to the semiconductor memory unit 605. That is, the encoder 601 generates a spatially coupled code frame based on the data frame. On the other hand, the decoder 613 incorporates the decoder according to each embodiment. The decoder 613 carries out error correcting decoding on data read from the semiconductor memory unit 605. That is, the decoder 613 carries out windowed decoding on the spatially coupled code frame to obtain decoded data (that is, a data frame).

The storage apparatus 603 in FIG. 8 includes no functional unit corresponding to the channel estimator 105 in FIG. 1, but may include a functional unit that estimates the channel information. Moreover, as described below, the decoder 613 may control the window size based on the channel information.

(First Embodiment)

A decoder according to a first embodiment carries out windowed decoding on a spatially coupled code. Iterative decoding (that is, BP decoding) that is a kind of a technique for decoding an LDPC code will be described. Then, windowed decoding carried out by the decoder according to the present embodiment will be described.

In general, the structure of a parity check matrix can be expressed using a Tanner graph. The Tanner graph is expressed by a variable node group, a check node group, and edges formed between the variable node group and the check node group. Specifically, if an element in the $m^{th}$ row and $n^{th}$ column of a parity check matrix is 1, a check node Pm and a variable node Vn are joined together by an edge.

According to the BP decoding, firstly each variable node is provided with an input likelihood and then processing in which messages are exchanged between the variable nodes and the check nodes via the edges is iterated. When the iteration ends, the result of hard decision of the a posteriori likelihood of each variable node is output as a decoding result.

The BP decoding is excellent in an error rate characteristic but suffers a long delay time until a decoding result is output and high power consumption. Furthermore, the order of a computational complexity in the BP decoding of a spatially coupled code is 0 ($nL^2$). The computational complexity increases in proportion to the square of the number of links (L).

The spatially coupled code, which is a band matrix based on a parity check matrix for a regular LDPC code, can be efficiently decoded utilizing the structure of the parity check matrix for the spatially coupled code. Specifically, as shown in expression (1) below, the parity check matrix for the spatially coupled code has elements of 1 localized in the parity check matrix. Hence, the spatially coupled code can be decoded using a local parity check matrix.

$$H = \begin{bmatrix} H_0 & 0 & \cdots & 0 & 0 \\ H_1 & H_0 & \ddots & \vdots & \vdots \\ \vdots & H_1 & \ddots & 0 & \vdots \\ H_m & \vdots & \ddots & H_0 & 0 \\ 0 & H_m & \ddots & H_1 & H_0 \\ \vdots & 0 & \ddots & \vdots & H_1 \\ \vdots & \vdots & \ddots & H_m & \vdots \\ 0 & 0 & \cdots & 0 & H_m \end{bmatrix} \quad (1)$$

Each of a plurality of block matrices ($H_0, \ldots, H_m$) included in Expression (1) corresponds to a (n−k)×n sparse matrix. That is, the parity check matrix (H) in Expression (1) is (L+m)(n−k) rows×Ln columns in size. Each codeword defined by the parity check matrix is Ln in code length and (L+m)(n−k) in parity length, where m denotes a parameter called a memory size.

Figures 9, 10:
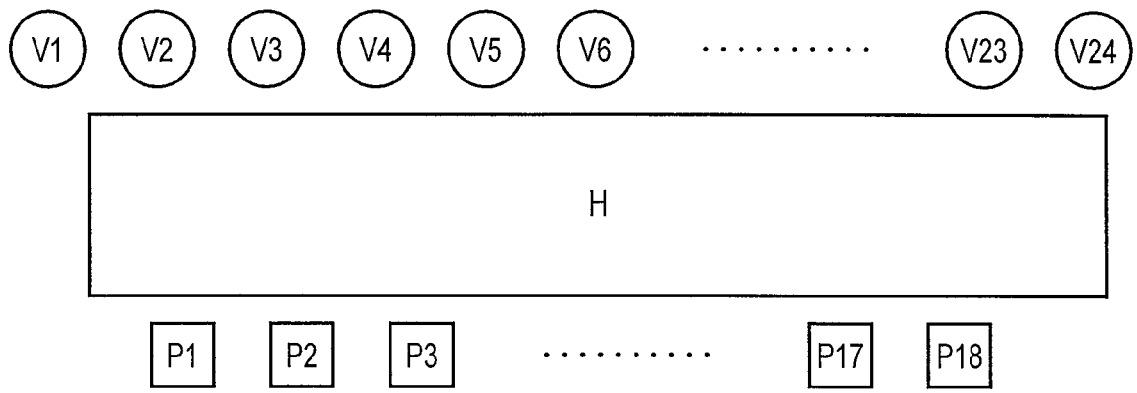
FIG. 9 is a diagram illustrating a parity check matrix for a spatially coupled code.
FIG. 10 is a diagram showing a Tanner graph of the parity check matrix in FIG. 9.

FIG. 9 illustrates a parity check matrix for a spatially coupled code. In the parity check matrix in FIG. 9, L=2, m=1, n=12, and k=6. That is, the parity check matrix in FIG. 9 is 18 rows×24 columns in size. Each codeword defined by the parity check matrix is 24 bits in code length and 18 bits in parity length. The parity check matrix in FIG. 9 is a band matrix based on two block matrices ($H_0$ and $H_1$) into which a 6 rows×12 columns parity check matrix for a regular LDPC code is expanded.

Specifically, the first block matrix ($H_0$) is arranged from the 1st row and 1st column to the $6^{th}$ row and $12^{th}$ column, and the second block matrix ($H_1$) is arranged from the $7^{th}$ row and 1st column to the $12^{th}$ row and $12^{th}$ column. Moreover, the first block matrix ($H_0$) is arranged again from the $7^{th}$ row and $13^{th}$ column to the $12^{th}$ row and $24^{th}$ column, and the second block matrix ($H_1$) is arranged again from the $13^{th}$ row and $13^{th}$ column to the 18$^{th}$ row and 24$^{th}$ column. The parity check matrix in FIG. 9 can also be expressed by:

$$H = \begin{pmatrix} H_0 & 0 \\ H_1 & H_0 \\ 0 & H_1 \end{pmatrix} \quad (2)$$

The parity check matrix in FIG. 9 can be expressed by a Tanner graph shown in FIG. 10. For simplification, edges are omitted from the Tanner graph in FIG. 10. In actuality, for example, a variable node V1 is connected to check nodes P1, P2, and P4 via edges. A check node P3 is connected to variable nodes V2, V3, and V4 via edges. A column weight for the parity check matrix in FIG. 9 is 3, and thus the total number of edges connected to each variable mode is 3.

As illustrated in FIG. 3, windowed decoding allows decoding to be carried out using a local parity check matrix using a window that is smaller than a parity check matrix in size. A thick frame in FIG. 3 represents a window. The window is designed to include a plurality of block matrices (for example, $H_0$, $H_1$, and $H_2$ in FIG. 3) in the parity check matrix within the frame thereof. The window is typically designed to include W block matrices in a row direction and W block matrices in a column direction, that is, a total of W×W block matrices, within the frame of the window. The block matrices included in the window frame are used in decoding using the local parity check matrix.

Specifically, the windowed decoding allows a decoding process to be carried out on each of the target bit sequences into which a spatially-spatially coupled code frame to be decoded (hereinafter referred to as a target frame) is divided. The size of the target bit sequence depends on the column size (n) of each of the block matrices included in the parity check matrix. When the decoding of the target bit sequence ends, the result of decoding of the target bit sequence is output, with the window sliding rightward and downward. In conjunction with the sliding, the target bit sequence shifts, and finally the result of decoding of the entire target frame is obtained.

In FIG. 3, L=8, m=2, and W=4. That is, the parity check matrix shown in FIG. 3 is 10(n−k) rows×8n columns in size. Each codeword defined by the parity check matrix is 8n bits in code length and 10(n−k) bits in parity length. Furthermore, the window includes four block matrices in the row direction and four block matrices in the column direction, that is, a total of 16 block matrices.

The windowed decoding allows the result of decoding of each target bit sequence to be output, enabling a reduction in delay time compared to the BP decoding, which needs to output the result of decoding of each target frame. Specifically, if the window size is W(n−k) rows and Wn columns, the delay time involved in the windowed decoding based on the window size is the delay time involved in the BP decoding multiplied by W/L. W is smaller than L, and thus W/L is less than 1.

Furthermore, if the window size is W(n−k) rows×Wn columns, the order of computational complexity of the windowed decoding based on the window size is 0 (nLW$^2$). Thus, the windowed decoding allows the target frame to be decoded with a smaller computational complexity (that is, lower power consumption) than the BP decoding when $W<\sqrt{L}$.

Moreover, the effect of a reduction in computational complexity and delay time increases with decreasing window size used in the windowed decoding. On the other hand, a reduced window size causes an error rate characteristic to be degraded, and regardless of the value to which the window size is set, an error rate characteristic exceeding that of the BP decoding cannot be achieved.

The decoder according to the first embodiment comprises an input likelihood storage unit 201, a window size control unit 202, a parity check matrix storage unit 203, a windowed decoder 204, and a decoded data storage unit 205 as illustrated in FIG. 2. The decoder in FIG. 2 decodes the target frame using the parity check matrix that defines the spatially coupled code.

The decoder in FIG. 2 is expected to be incorporated into the communication apparatus illustrated in FIG. 1 but may be incorporated into any other communication system or a recording and reproducing system (for example, the one shown in FIG. 8).

The input likelihood storage unit 201 acquires the input likelihood of the target frame from an outside of the decoder (for example, the demodulator 104). Specifically, the input likelihood storage unit 201 manages the input likelihood of each of the target bit sequences into which the target frame is divided. For example, the input likelihood storage unit 201 can discard the input likelihood of a target bit sequence when the decoding of the target bit sequence ends. The input likelihood held in the input likelihood storage unit 201 is output to the windowed decoder 204 as necessary.

The window size control unit 202 inputs the channel information from the channel estimator 105. The window size control unit 202 can set the window size applied to the target frame based on the channel information. Alternatively, the window size control unit 202 may control the window size applied to the target frame based on parameters other than the channel information. The window size control unit 202 outputs window size information indicative of the set window size to the windowed decoder 204.

The window may include W block matrices in the row direction and W block matrices in the column direction, that is, a total of W×W block matrices as described above, or $W_1$ block matrices in the row direction and $W_2$ ($\neq W_1$) block matrices in the column direction, that is, a total of $W_1 \times W_2$ block matrices.

The parity check matrix storage unit 203 holds information about the parity check matrix used in the decoder in FIG. 2. The information about the parity check matrix may allow the parity check matrix to be uniquely identified.

That is, the information about a parity check matrix may be information indicative of all the elements of the parity check matrix or information that identifies those rows and columns of the parity check matrix in which elements of 1 are arranged. Furthermore, as described above, according to the present embodiment, the parity check matrix is based on m+1 block matrices ($H_0, \ldots, H_m$) obtained by expanding a parity check matrix for a regular LDPC code. Thus, the information about the parity check matrix is information about the parity check matrix for the regular LDOC code or the m+1 block matrices.

The windowed decoder 204 inputs window size information from the window size control unit 202, and carries out windowed decoding on the target frame in accordance with the window size indicated by the window size information. Specifically, according to the window size and the current window position, the windowed decoder 204 acquires the input likelihood of a plurality of variable nodes including at least the target bit sequence, from the input likelihood storage unit 201, and inputs the information about the parity check matrix from the parity check matrix storage unit 203.

Then, the windowed decoder 204 obtains the result of decoding of the target bit sequence by using the input likelihood of a plurality of variable nodes and a submatrix within the window of the parity check matrix to carry out iterative decoding based on a Sum-Product algorithm, a Min-Sum algorithm or the like. The iterative decoding ends when parity checks are satisfied for all the check nodes within the window frame before the number of trials reach an upper limit value or when the parity checks are not satisfied for all the check nodes even though the number of trials has reached the upper limit value.

Satisfying the parity check on the check node means that the summation, on a binary finite field, of code bits corresponding to all the variable nodes connected to the check nodes is zero. In other words, a failure to satisfy the parity check on the check node means that the summation, on the binary finite field, of the code bits corresponding to all the variable nodes connected to the check nodes is one.

Windowed decoding at the second and subsequent window positions requires the results of decoding of the previous target bit sequences for parity checks on some of the check nodes within the window frame. Hence, the windowed decoder 204 sequentially outputs the results of decoding of target bit sequences to the decoded data storage unit 205 and inputs the results from the decoded data storage unit 205 as necessary.

The left side of FIG. 3 illustrates a target frame for windowed decoding at the first window position and a submatrix used for the windowed decoding. For the windowed decoding at the first window position, the windowed decoder 204 acquires the input likelihood of the first to $4n^{th}$ variable nodes from the input likelihood storage unit 201. The first to $n^{th}$ variable nodes correspond to the target bit sequence. Furthermore, the windowed decoder 204 inputs information about the submatrix in the first row and the first column to the $4(n-k)^{th}$ row and the $4n^{th}$ column from the parity check matrix storage unit 203.

Then, the windowed decoder 204 carries out iterative decoding using the input likelihood of the first to $4n^{th}$ variable nodes and the submatrix in the first row and the first column to the $4(n-k)^{th}$ row and the $4n^{th}$ column of the parity check matrix, to obtain the result of decoding of the target bit sequence (that is, the first to $n^{th}$ variable nodes). The windowed decoder 204 outputs the result of decoding of the target bit sequence to the outside of the decoder and to the decoded data storage unit 205.

Upon finishing the windowed decoding at the first window position, the windowed decoder 204 shifts the window to the second window position. Specifically, the windowed decoder 204 shifts the window by n columns rightward and by (n−k) rows downward.

The right side of FIG. 3 illustrates a submatrix used in windowed decoding at the second window position. For the windowed decoding at the second window position, the windowed decoder 204 acquires the input likelihood of the $n+1^{th}$ to $5n^{th}$ variable nodes from the input likelihood storage unit 201. The $n+1^{th}$ to $2n^{th}$ variable nodes correspond to the target bit sequence. Furthermore, the windowed decoder 204 inputs information about the submatrix in the $n-k+1^{th}$ row and the $n+1^{th}$ column to the $5(n-k)^{th}$ row and the $5n^{th}$ column of the parity check matrix from the parity check matrix storage unit 203. Moreover, the windowed decoder 204 inputs the result of decoding (for example, the a posteriori likelihood or the result of hard decision of the a posteriori likelihood) of the first to $n^{th}$ variable nodes corresponding to the already decoded bit sequence, from the decoded data storage unit 205.

Then, the windowed decoder 204 carries out iterative decoding using the input likelihood of the $n+1^{th}$ to $5n^{th}$ variable nodes and the submatrix in the $n-k+1^{th}$ row and the $n+1^{th}$ column to the $5(n-k)^{th}$ row and the $5n^{th}$ column of the parity check matrix, to obtain the result of decoding of the target bit sequence (that is, the $n+1^{th}$ to $2n^{th}$ variable nodes). The windowed decoder 204 outputs the result of decoding of the target bit sequence to the outside of the decoder and to the decoded data storage unit 205.

The result of decoding of the first to $n^{th}$ variable nodes is utilized for parity checks on the check nodes from the $n-k+1^{th}$ row to the $3(n-k)^{th}$ row. The result of decoding of the first to $n^{th}$ variable nodes may be the result of hard decision (that is, only information indicative of a positive sign or a negative sign), the a posteriori likelihood, a value obtained by the a posteriori likelihood by any positive value, or a value obtained by adding any value to the a posteriori likelihood. Furthermore, if during the windowed decoding at the first window position, the parity check on any of the check nodes fails to be satisfied, the windowed decoding at the second window position may be carried out without the use of messages from this check node to the corresponding variable nodes.

The windowed decoder 204 sequentially carries out windowed decoding at the third and subsequent positions. Then, the windowed decoder 204 finally carries out windowed decoding at the $L^{th}$ window position to finish decoding the entire target frame. If the parity check on at least one check node is not satisfied yet when the decoding of the entire target frame ends, the a posteriori likelihood of the target frame held in the decoded data storage unit 205 may be fed back to the outside of the decoder (for example, the demodulator 104) in order to update the input likelihood of the target frame and then retry the decoding of the target frame.

The decoded data storage unit 205 sequentially inputs the result of decoding of the target bit sequence from the windowed decoder 204 as described above. The decoded data storage unit 205 holds the decoding result in the form of the a posteriori likelihood or the like and outputs the decoding result to the windowed decoder 204 as necessary. Furthermore, if the decoding of the target frame fails, the decoded data storage unit 205 may feed back the held decoding result to the outside of the decoder (for example, the demodulator 104).

The technical significance of control of the window size based on the channel information will be described below.

Figure 4:
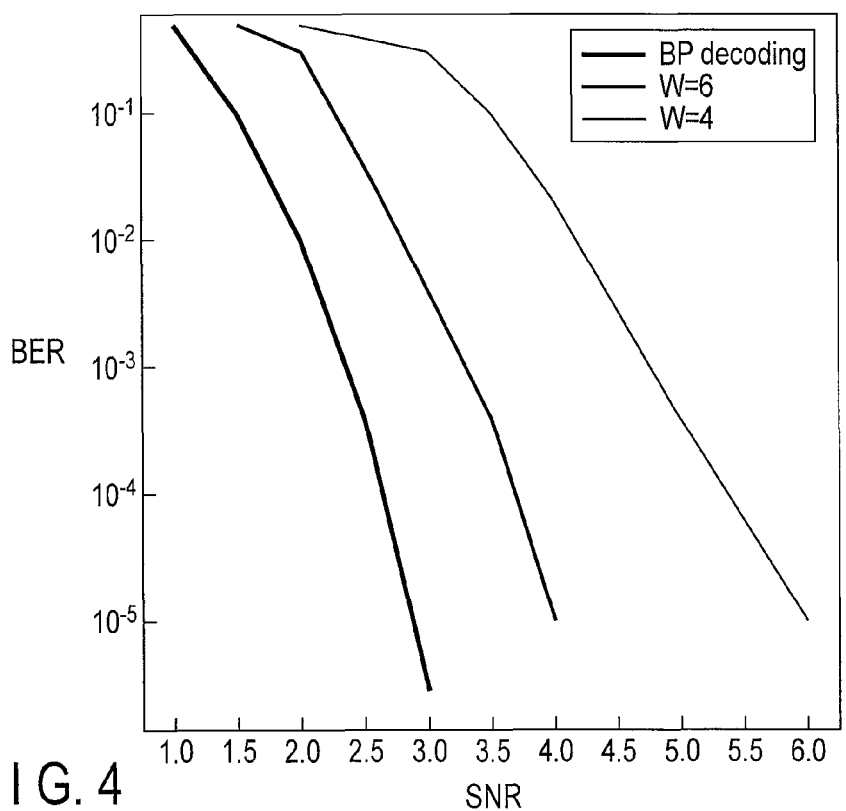
FIG. 4 is a graph illustrating the relationship between an error rate characteristic and an SNR for various window sizes.

As described above, the effect of a reduction in computational complexity and delay time increases with decreasing window size used in the windowed decoding. On the other hand, a reduced window size causes an error rate characteristic to be degraded, and regardless of the value to which the window size is set, an error rate characteristic exceeding that of the BP decoding cannot be achieved. Moreover, as illustrated in FIG. 4, even with the same size, the error rate characteristic varies depending on the status (for example, the SNR) of a channel on which a spatially coupled code frame is received. In the communication system or recording and reproducing system in which the decoder in FIG. 2 is incorporated, the status of the channel on which the spatially coupled code frame is received is generally inconstant.

Hence, the window control unit 202 adaptively controls the window size based on the channel information to stably achieve the required error rate characteristic regardless of a variation in the status of the channel, and suppresses the power consumption and delay time. For example, the window control unit 202 can achieve the required error rate characteristic while suppressing the power consumption and delay time by setting the window size to be applied to the current target frame based on the minimum value that enables the required error rate characteristic to be achieved under the current channel status. In an example in FIG. 4, if the required error rate characteristic is bit error rate (BER)=$10^{-4}$, the window control unit 202 sets the window size to be applied to the target frame to, for example, 6 when the SNR is 4 dB and to, for example, 4 when the SNR is 6 dB.

Alternatively, the window control unit 202 may control the window size based on the required power consumption or the required delay time. For example, the window control unit 202 may set the upper limit of the window size so as to prevent the required power consumption or the required delay time from being exceeded. Furthermore, the window control unit 202 may control the window size based on a part or all of the channel information, the required error rate characteristic, the required power consumption and the required delay time. The required error rate characteristic, the required power consumption, and the required delay time may be collectively referred to as the required quality. Furthermore, the required quality may mean a required value for another particular capability of the decoder.

The decoder according to the present embodiment carries out a process of decoding the target frame, for example, as shown in FIG. 5. The decoding process in FIG. 5 starts in step S301.

In step S301, the input likelihood storage unit 201 sequentially inputs and holds the input likelihood of the target frame starting with the head of frame. The window size control unit 202 determines a value for the window size (W) to be applied to the target frame input in step S301, for example, based on the channel information (step S302).

The windowed decoder 204 initializes parameters required to decode the target frame input in step S301 (step S303). Specifically, the windowed decoder 204 sets to 1 a variable (pos) that identifies the current window position and sets to 1 a variable (i) that counts the number of trials of iterative decoding at the current window position.

When step S302 and step S303 end, the process proceeds to step S304. In step S304, the windowed decoder 204 carries out windowed decoding at the current window position (pos) based on the window size determined in step S302. If the windowed decoding in step S304 allows parity checks to be satisfied for all the check nodes within the window frame, the decoding of the target bit sequence is successful, and the process proceeds to step S308 (step S305). Otherwise, the process proceeds to step S306.

In step S306, the windowed decoder 204 determines whether or not the number of trials of iterative decoding (i) has reached an upper limit value (Imax). If the number of trials of iterative decoding (i) has reached the upper limit value (Imax), the decoding of the target bit sequence has failed. Then, the process proceeds to step S308. Otherwise, the process proceeds to step S307.

In step S307, the windowed decoder 204 increments by one and the process returns to step S304. In step S308, the windowed decoding at the current window position (pos) is complete (the windowed decoding has succeeded or failed), and thus the windowed decoder 204 outputs the result of decoding of the target bit sequence to the decoded data storage unit 205. The process proceeds to step S309.

In step S309, the windowed decoder 204 determines whether or not the current window position (pos) has reached the trailing position (L). If the current window position (pos) has reached the trailing position (L), the decoding of the target frame is complete, and thus the decoding process in FIG. 5 ends. If the current window position (pos) has not reached the trailing position (L), the decoding of the target frame is not complete, and thus the decoding process proceeds to step S310.

As described above, if the decoding of the target frame has failed, the decoder may feed back the decoding result held in the decoded data storage unit 205 to the outside of the decoder and carry out the decoding process in FIG. 5 again based on the updated input likelihood.

In step S310, the windowed decoder 204 increments the current window position (pos) by one and resets the number of trials of iterative decoding (i) at the current window position (pos) to 1. The process returns to step S304. Incrementing the window position (pos) by one shifts the position of the window by (n−k) columns rightward and by n rows downward.

As described above, the decoder according to the first embodiment controls the window size for windowed decoding of the spatially coupled code frame, for example, based on one or both of the channel information or the required quality. Thus, the decoder adaptively controls the window size for each target frame, thus allowing each target frame to be efficiently decoded.

(Second Embodiment)

When windowed decoding of the target frame fails, a decoder according to a second embodiment increases the window size and then carries out windowed decoding on the target frame again. The decoder according to the present embodiment may comprise functional units that are the same as or similar to the functional units shown in FIG. 2.

Specifically, the decoder according to the present embodiment carries out a decoding process on the target frame, for example, as shown in FIG. 6. The decoding process in FIG. 6 starts in step S401.

In step S401, the input likelihood storage unit 201 sequentially inputs and holds the input likelihood of the target frame starting with the head of frame. The window size control unit 202 sets an initial value for the window size (W) to be applied to the target frame received in step S401 (step S402). In step S402, the initial value of the window size may be determined according to the first embodiment. However, the initial value may be determined in accordance with any other technique. For example, a certain constant (w1) may be prepared and set to be the initial value of the window size (w) in step S402.

When step S402 ends, the process proceeds to step S403. In step S403, the windowed decoder 204 carries out windowed decoding on the target frame. The windowed decoding carried out in step S403 may correspond to the processing from step S303 to step S310 in FIG. 5, processing from step S503 to step S513 in FIG. 7 described below, or processing not shown in the drawings. If the windowed decoding in step S403 has decoded the entire target frame correctly, the process in FIG. 6 ends. Otherwise, the process proceeds to step S405.

In step S405, the window size control unit 202 determines whether or not the window size (W) has reached a maximum value (Wmax). If the window size (W) has reached the maximum value (Wmax), the window size (W) can no longer be increased, and thus the process in FIG. 6 ends. Otherwise, the process proceeds to step S406. Wmax may be L or any integer smaller than L. In step S406, the window size control unit 202 increases the window size (W) above the current value. The magnitude of the increase may be constant or variable. After step S406, the process returns to step S403. The windowed decoder 204 carries out windowed decoding on the target frame using a window size larger than the preceding one.

As described above, the decoder according to the second embodiment increases the window size every time the windowed decoding of the target frame fails. Thus, the decoder can improve the error rate characteristic as necessary to efficiently decode each target frame.

(Third Embodiment)

When windowed decoding of the target bit sequence fails, a decoder according to a third embodiment increases the window size and then carries out windowed decoding on the target bit sequence again. The decoder according to the present embodiment may comprise functional units that are the same as or similar to the functional units shown in FIG. 2.

Specifically, the decoder according to the present embodiment carries out a decoding process on the target frame, for example, as shown in FIG. 7. The decoding process in FIG. 7 starts in step S501.

In step S501, the input likelihood storage unit 201 sequentially inputs and holds the input likelihood of the target frame starting with the head of frame. The window size control unit 202 sets an initial value for the window size (W) to be applied to the target frame input in step S501 (step S502). In step S502, the initial value of the window size may be determined according to the first embodiment. However, the initial value may be determined in accordance with any other technique. For example, a certain constant (w1) may be prepared and set to be the initial value of the window size (W) in step S502.

The windowed decoder 204 initializes the parameters required to decode the target frame input in step S501 (step S503). Specifically, the windowed decoder 204 sets to 1 the variable (pos) that identifies the current window position and sets to 1 the variable (i) that counts the number of trials of iterative decoding at the current window position.

When step S502 and step S503 end, the process proceeds to step S504. In step S504, the windowed decoder 204 carries out windowed decoding at the current window position (pos) based on the current window size (W). If the windowed decoding in step S504 allows parity checks to be satisfied for all the check nodes within the window frame, the decoding of the target bit sequence is successful, and the process proceeds to step S511 (step S505). Otherwise, the process proceeds to step S506.

In step S506, the windowed decoder 204 determines whether or not the number of trials of iterative decoding (i) has reached the upper limit value (Imax). If the number of trials of iterative decoding (i) has reached the upper limit value (Imax), the decoding of the target bit sequence at the current window size (W) has failed, and the process proceeds to step S508. Otherwise, the process proceeds to step S507. In step S507, the windowed decoder 204 increments i by one, and the process proceeds to step S504.

In step S508, the window size control unit 202 determines whether or not the window size (W) has reached the maximum value (Wmax). If the window size (W) has reached the maximum value (Wmax), the window size (W) can no longer be increased, and thus the decoding of the target bit sequence has failed. Then, the process proceeds to step S511. Otherwise, if the window size (W) has not reached the maximum value (Wmax), the process proceeds to step S509. Wmax may be L or any integer smaller than L.

In step S509, the window size control unit 202 increases the window size (W) above the current value. The magnitude of the increase may be constant or variable. After step S509, the process proceeds to step S510. In step S510, the windowed decoder 204 resets the number of trials of iterative decoding (i) at the current window position (pos) to 1. The process returns to step S504. In step S504, the windowed decoder 204 carries out windowed decoding on the target frame using a window size larger than the preceding one.

In step S511, the windowed decoding at the current window position (pos) is complete (the windowed decoding has succeeded or failed), and thus the windowed decoder 204 outputs the result of decoding of the target bit sequence to the decoded data storage unit 205. The process proceeds to step S512.

In step S512, the windowed decoder 204 determines whether or not the current window position (pos) has reached the trailing position (L). If the current window position (pos) has reached the trailing position (L), the decoding of the target frame is complete, and thus the decoding process in FIG. 7 ends. If the current window position (pos) has not reached the trailing position (L), the decoding of the target frame is not complete, and thus the decoding process proceeds to step S513.

As described above, if the decoding of the target frame has failed, the decoder may feed back the decoding result held in the decoded data storage unit 205 to the outside of the decoder and carry out the decoding process in FIG. 7 again based on the updated input likelihood.

In step S513, the windowed decoder 204 increments the current window position (pos) by one and resets the number of trials of iterative decoding (i) at the current window position (pos) to 1. The process returns to step S504. Incrementing the window position (pos) by one shifts the position of the window by (n−k) columns rightward and by n rows downward.

The window size (W) is increased in step S509 as described above, and thus in step S513, the window size (W) may be different from the initial value set in step S502. The window size control unit 202 may maintain the current window size (W) for the next target bit sequence or change the current window size (W).

For example, the window size control unit 202 may adjust the current window size (W) such that the window size is closer to the initial value set in step S502. Alternatively, the window size control unit 202 may determine again the initial value of the window size to be applied to the next target bit sequence by carrying out processing that is the same as or similar to the processing of step S502. Even if the window size excessively increases in the previous windowed decoding of the target bit sequence, the above-described processing enables the window size to be reduced to an appropriate value.

As described above, the decoder according to the third embodiment increases the window size every time the windowed decoding of the target bit sequence fails. Thus, the decoder can improve the error rate characteristic as necessary to efficiently decode each target bit sequence.

The processing in the above-described embodiments can be implemented using a general-purpose computer as basic hardware. A program implementing the processing in each of the above-described embodiments may be stored in a computer readable storage medium for provision. The program is stored in the storage medium as a file in an installable or executable format. The storage medium is a magnetic disk, an optical disc (CD-ROM, CD-R, DVD, or the like), a magnetooptic disc (MO or the like), a semiconductor memory, or the like. That is, the storage medium may be in any format provided that a program can be stored in the storage medium and that a computer can read the program from the storage medium. Furthermore, the program implementing the processing in each of the above-described embodiments may be stored on a computer (server) connected to a network such as the Internet so as to be downloaded into a computer (client) via the network.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A decoder comprising:
a control unit configured to determine a window size applied to a first target frame to be a first value and to determine a window size applied to a second target frame different from the first target frame to be a second value different from the first value; and
a decoding unit configured to carry out windowed decoding of a spatially coupled code on the first target frame with the window size set to the first value and to carry out windowed decoding of a spatially coupled code on the second target frame with the window size set to the second value.

2. The decoder according to claim 1, wherein an SNR of the first target frame is lower than an SNR of the second target frame, and
the first value is greater than the second value.

3. The decoder according to claim 1, wherein the control unit changes the window size applied to the first target frame to a third value greater than the first value if the windowed decoding of the first target frame fails and if the first target frame is to be decoded again.

4. The decoder according to claim 1, wherein the second target frame is different from the first target frame in at least one of required error rate characteristic, required power consumption, and required delay time.

5. The decoder according to claim 1, wherein the control unit changes the window size applied to a first target bit sequence included in the first target frame to a fourth value greater than the first value if the first target bit sequence fails to be decoded by a first number of iterative decoding operations which is equal to or smaller than a maximum number of iterative decoding operations.

6. The decoder according to claim 5, wherein the control unit changes the window size applied to a second target bit sequence next to the first target bit sequence in the first target frame to a fifth value smaller than the fourth value if the first target bit sequence is successfully decoded.

7. A decoding method comprising:
determining a window size applied to a first target frame to be a first value and determining a window size applied to a second target frame different from the first target frame to be a second value different from the first value; and
carrying out windowed decoding of a spatially coupled code on the first target frame with the window size set to the first value and carrying out windowed decoding of a spatially coupled code on the second target frame with the window size set to the second value.

8. The method according to claim 7, wherein an SNR of the first target frame is lower than an SNR of the second target frame, and
the first value is greater than the second value.

9. The method according to claim 7, further comprising: changing the window size applied to the first target frame to a third value greater than the first value if the windowed decoding of the first target frame fails and if the first target frame is to be decoded again.

10. The method according to claim 7, wherein the second target frame is different from the first target frame in at least one of required error rate characteristic, required power consumption, and required delay time.

11. The method according to claim 7, further comprising: changing the window size applied to a first target bit sequence included in the first target frame to a fourth value greater than the first value if the first target bit sequence fails to be decoded by a first number of iterative decoding operations which is equal to or smaller than a maximum number of iterative decoding operations.

12. The method according to claim 11, further comprising: changing the window size applied to a second target bit sequence next to the first target bit sequence in the first target frame to a fifth value smaller than the fourth value if the first target bit sequence is successfully decoded.

13. A communication apparatus comprising:
a demodulator configured to demodulate a received signal to obtain the first target frame and the second target frame; and
the decoder according to claim 1.

14. The apparatus according to claim 13, wherein an SNR of the first target frame is lower than an SNR of the second target frame, and
the first value is greater than the second value.

15. The apparatus according to claim 13, wherein the control unit changes the window size applied to the first target frame to a third value greater than the first value if the windowed decoding of the first target frame fails and if the first target frame is to be decoded again.

16. The apparatus according to claim 13, wherein the second target frame is different from the first target frame in at least one of required error rate characteristic, required power consumption, and required delay time.

17. The apparatus according to claim 13, wherein the control unit changes the window size applied to a first target bit sequence included in the first target frame to a fourth value greater than the first value if the first target bit sequence fails to be decoded by a first number of iterative decoding operations which is equal to or smaller than a maximum number of iterative decoding operations.

18. The apparatus according to claim 17, wherein the control unit changes the window size applied to a second target bit sequence next to the first target bit sequence in the first target frame to a fifth value smaller than the fourth value if the first target bit sequence is successfully decoded.

* * * * *